(12) United States Patent
Hatani et al.

(10) Patent No.: US 6,337,646 B1
(45) Date of Patent: Jan. 8, 2002

(54) DIGITAL TO ANALOG CONVERTER WITH NONLINEAR ERROR COMPENSATION

(75) Inventors: Naohisa Hatani, Ohgaki; Manabu Ohkubo, Otsu, both of (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/422,635

(22) Filed: Oct. 21, 1999

(30) Foreign Application Priority Data

Nov. 4, 1998 (JP) .......................................... 10-313179

(51) Int. Cl.⁷ ............................. H03M 1/06; H03M 1/66
(52) U.S. Cl. ...................................... 341/144; 341/118
(58) Field of Search ............................... 341/144, 118, 341/120, 150, 154, 143

(56) References Cited

U.S. PATENT DOCUMENTS 5,153,592 A  * 10/1992 Fairchild et al. ............ 341/118
5,703,586 A  * 12/1997 Tucholski ................ 341/120 X
6,154,158 A  * 11/2000 Walker ........................ 341/118
6,191,715 B1 *  2/2001 Fowers ........................ 341/120
6,278,391 B1 *  8/2001 Walker ........................ 341/118

* cited by examiner

Primary Examiner—Patrick Wamsley
(74) Attorney, Agent, or Firm—Steven Capella

(57) ABSTRACT

To provide a D/A converter and a D/A converting method in which a nonlinear error of an analog output obtained in accordance with a digital input can be decreased without using any specific analog process.

An n-bit D/A converter (2) includes: correction signal generating means (4) for generating an m-bit digital correction signal (wherein m is a positive integer) in accordance with an n-bit digital input signal D (wherein n is a positive integer of 2 or more); and D/A conversion means (6) for converting an (n+m)-bit digital signal consisting of the n-bit input signal D and the m-bit correction signal into an analog signal.

15 Claims, 6 Drawing Sheets

DIGITAL TO ANALOG CONVERTER WITH NONLINEAR ERROR COMPENSATION

FIELD OF THE INVENTION

The present invention relates to a digital-to-analog converter and a digital-to-analog converting method, and more particularly, it relates to a digital-to-analog converter and a digital-to-analog converting method in which a nonlinear error of an analog output resulting from digital-to-analog conversion (D/A conversion) is decreased without using any specific analog process.

BACKGROUND OF THE INVENTION

With recent high integration of large scale integrated circuits (herein after referred to as LSIs), there are increasing demands for LSIs mounting both analog circuits and digital circuits. A high-accuracy and low-cost digital-to-analog converter (hereinafter referred to as a D/A converter) and a high-accuracy and low-cost analog-to-digital converter (hereinafter referred to as an A/D converter) are required to be mounted on such LSIs. Therefore, it is significant to realize a high-accuracy analog circuit by using a general semiconductor process without using a high-accuracy but high-priced analog process.

As an example of a D/A converter, an n-bit D/A converter 80 using a ladder circuit (R-2R resistance net) 82 is shown in FIG. 7. The D/A converter 80 of the R-2R resistance net comprises the ladder circuit 82 and a switch controller 84. The ladder circuit 82 comprises a resistance net of resistors R and 2R, and n (which is an integer) analog switches S (Sn, Sn-1, Sn-2, . . . , S4, S3, S2 and S1). The switches S (Sn, Sn-1, Sn-2, . . . , S4, S3, S2 and S1) are connected to the switch controller 84 respectively through control wires W (Wn, Wn-1, Wn-2, . . . , W4, W3, W2 and W1).

The switches Sn, Sn-1, Sn-2, . . . , S4, S3, S2 and S1 correspond respectively to bits Dn, Dn-1, Dn-2, . . . , D4, D3, D2 and D1 of an n-bit digital input signal D (i.e., "Dn Dn-1 Dn-2 . . . D4 D3 D2 D1") input to the switch controller 84. Under control of the switch controller 84, when a bit Dk (wherein k is an integer of 1 to n) of the input signal D is "1", the switch Sk corresponding to the bit Dk is switched to a voltage Vref, and when the bit Dk is "0", the switch Sk corresponding to the bit Dk is switched to a ground. In this manner, the switches S are switched in accordance with the input signal D so as to adjust a voltage applied to the ladder circuit 82. Thus, the D/A converter 80 can output an analog signal (namely, an output voltage Vout) in accordance with the input digital signal D.

Since this R-2R resistance net 82 includes two types of resistors R and 2R (it includes one type when two resistors R are connected in series to form a resistor 2R). Therefore, the circuit can be constructed by using the resistors each having the same accuracy and temperature coefficient. Furthermore, a high-accuracy D/A converter can be achieved by securing comparative precision of the respective resistors not by securing the absolute precision of each resistor. Accordingly, it can be considered that a high-accuracy D/A converter can be achieved by using resistors of uniform properties.

However, when resistors have voltage dependence, problems will arise even if the resistors of uniform properties are used. For example, in the case where the R-2R resistance net is formed by using a semiconductor process in which no high-accuracy resistance element is particularly used, the resistance element is often formed in an n-type diffused layer. However, depending on a voltage applied to the resistors, a depletion layer formed between the resistor and a p-type substrate is changed, so that the resistance value can be varied. When the resistance value is thus varied by the voltage applied to the resistor, it is difficult to achieve a high-accuracy D/A converter.

For example, FIG. 8 is a simplified circuit diagram of a 2-bit D/A converter (including a ladder circuit) 90, which corresponds to the case where n is 2 in the ladder circuit 82 (of the converter 80) of FIG. 7. In FIG. 8, resistors r2 and r1 each have the same properties and an uniform resistance value of 2R through the application of no voltage. In this circuit 90, switches not shown (corresponding to the switches S1 and S2 of FIG. 7) are switched in accordance with an input signal "D2 D1" so that voltages V2 and V1 applied to the resistors r2 and r1 can be varied as shown in TABLE 1 below.

TABLE 1

| D2 | D1 | V2 | V1 | r2 | r1 |
|---|---|---|---|---|---|
| 0 | 0 | 0 | 0 | 2R | 2R |
| 0 | 1 | 0 | Vref | 2R | 2R + ΔR |
| 1 | 0 | Vref | 0 | 2R + ΔR | 2R |
| 1 | 1 | Vref | Vref | 2R + ΔR | 2R + ΔR |

As shown in TABLE 1, since the resistors r1 and r2 have a voltage dependence, the resistors r1 and r2 each have the resistance value 2R when no voltage is applied. However, when a voltage Vref is applied, the resistance value is increased, for example, by ΔR to be 2R+Δ. In this manner, even when the resistors have the same properties, their resistance values are varied depending on whether or not a voltage is applied. Therefore, since the properties of the resistors are changed due to increase in an error of the resistance value, the conversion accuracy of the converter is degraded.

FIG. 9 shows a relationship between an error ΔV (=Vout−Vr) generated between an analog output voltage Vout and an ideal voltage Vr and a digital input signal D (which is shown in a range from 0 (zero) to FS (full scale)) in a 10-bit D/A converter using such voltage-dependent resistors in a ladder circuit. The ideal voltage Vr is increased by a predetermined voltage with an increase of a least significant bit (LSB) of the input signal D, and a relationship between the input signal D and the ideal output voltage Vr is substantially linearly varied. In FIG. 9, assuming that the error is substantially zero when the input signal D is 0 and FS, the error ΔV from the ideal output line (nonlinear error) reaches to the maximum error ΔV_max in the vicinity of ½FS. This maximum error ΔV_max largely affects the conversion accuracy of the D/A converter.

Thus, there is a need for a high-accuracy D/A converter and a high-accuracy D/A converting method in which a nonlinear error caused by a voltage dependence of a resistance element that degrades the accuracy of a D/A conversion can be corrected without using any specific analog process.

SUMMARY OF THE INVENTION

In the D/A converter of the present invention, an error (nonlinear error) between the output voltage of the D/A converter and an ideal output voltage can be corrected by using a correction signal generated by a correction circuit. By using the D/A converting method of the present invention capable of correcting the output voltage by using the correction signal, a high-accuracy and low-cost D/A converter can be realized without using any specific analog process.

The D/A converter of the present invention is characterized by comprising correction signal generating means for generating an m-bit digital correction signal (wherein m is a positive integer) in accordance with an n-bit digital input signal (wherein n is a positive integer of 2 or more); and digital-to-analog conversion means for converting an (n+m)-bit digital signal consisting of the n-bit input signal and the m-bit correction signal into an analog signal.

The D/A converting method of the present invention is characterized by comprising: a correction signal generating step of generating an m-bit digital correction signal (wherein m is a positive integer) in accordance with an n-bit digital input signal (wherein n is a positive integer of 2 or more); and an (n+m)-bit digital-to-analog converting step of converting an (n+m)-bit digital signal consisting of the n-bit digital input signal and the m-bit digital correction signal into an analog signal.

DETAILED DESCRIPTION OF THE INVENTION

Figure 1:
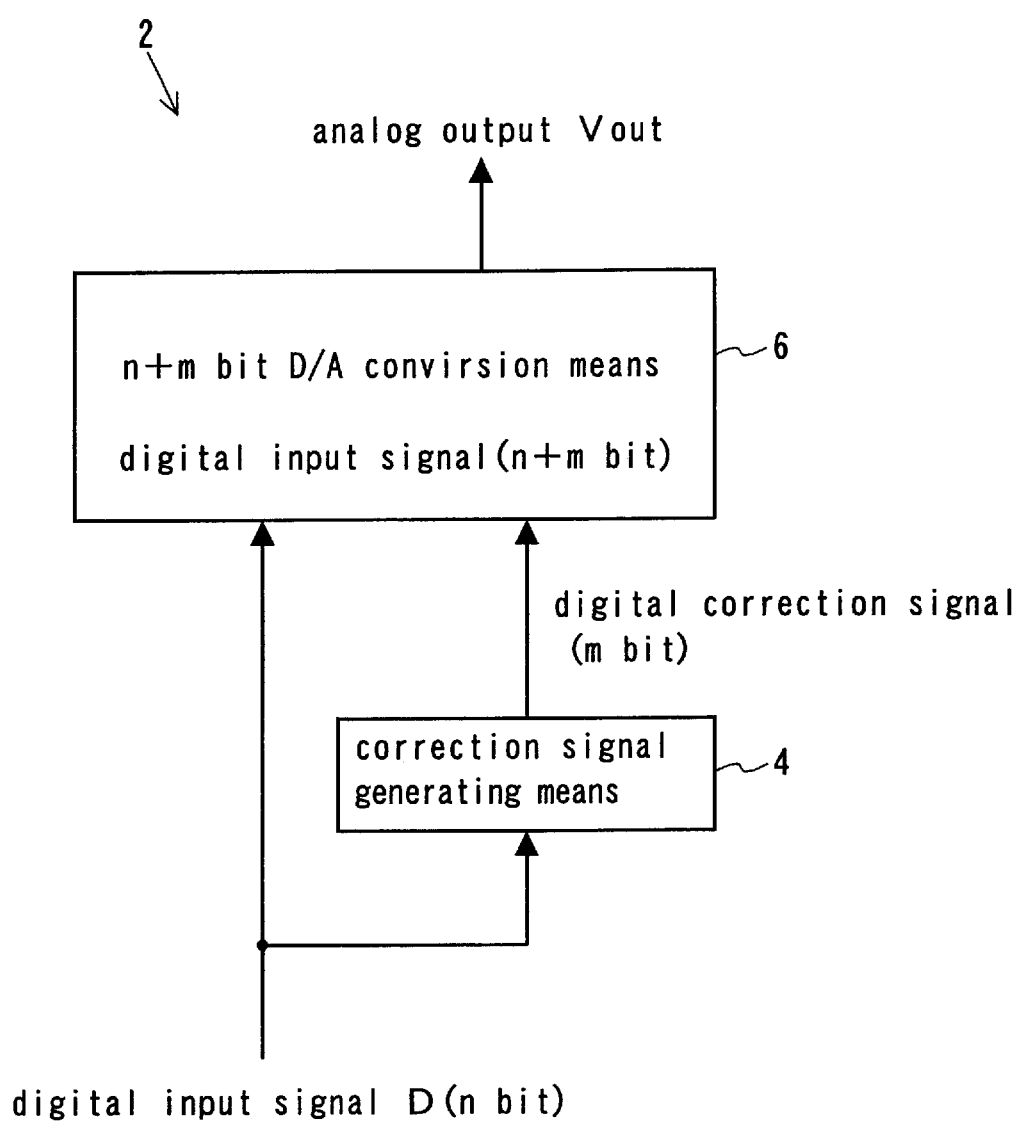
FIG. 1 is a block diagram showing the basic structure of a D/A converter according to the present invention.

Referring now to the accompanying drawings, preferred embodiments of a D/A converter according to the present invention will be described in detail below. FIG. 1 is a diagram showing the basic structure of the D/A converter of the present invention. The n-bit D/A converter 2 (wherein n is a positive integer of 2 or more) of the present invention includes: correction signal generating means 4 for generating an m-bit digital correction signal (wherein m is a positive integer) on the basis of high-order k bits (wherein k is a positive integer of n or less) of an n-bit input digital signal D; and D/A conversion means 6 for conducting digital-to-analog conversion of an (n+m)-bit digital signal consisting of the input signal (n bits) as high-order n bits and the correction signal (m bits) as low-order m bits. The correction signal is generated in accordance with a nonlinear error of an analog output voltage with respect to the input signal. In general, the correction signal is maximized when the nonlinear error is maximum with respect to the input signal, and it is minimized when the nonlinear error is minimum with respect to the input signal.

Figure 2:
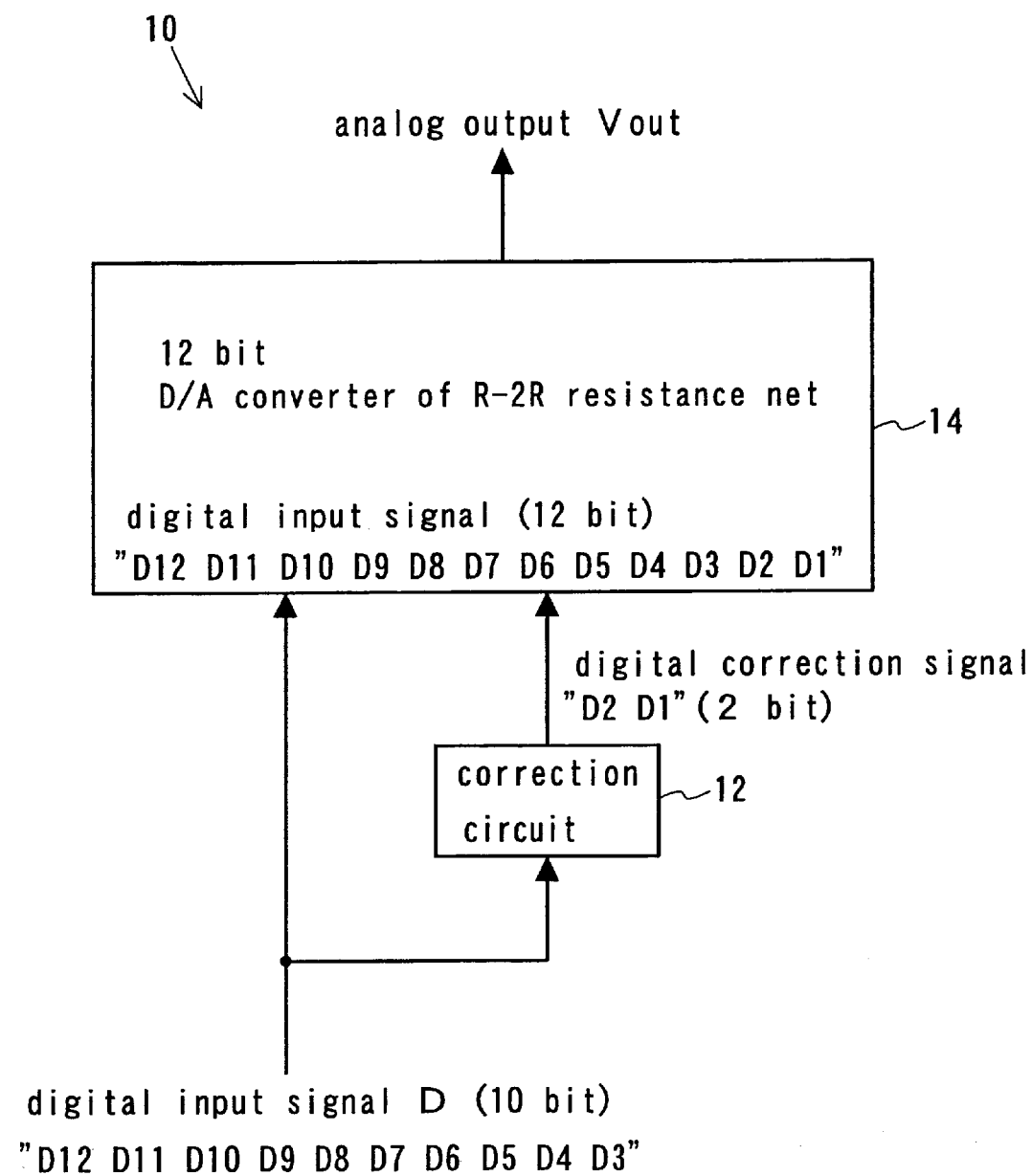
FIG. 2 is a block diagram showing an embodiment of the D/A converter of the present invention.

FIG. 2 is a diagram showing an application of the present invention to a D/A converter for a 10-bit signal. In FIG. 2, the D/A converter 10 for a 10-bit signal includes a 12-bit R-2R resistance net D/A converter (D/A conversion means) 14 and a correction circuit (correction signal generating means) 12 for generating a 2-bit correction signal. A digital input signal D (10 bits) is input to the correction circuit 12 as well as to high-order 10 bits of the digital input of the 12-bit D/A converter 14. The correction signal output from the correction circuit 12 is input to the low-order 2 bits of the digital input of 12-bit D/A converter 14. Thus, the 12-bit D/A converter 14 outputs an analog output signal (namely, an output voltage Vout) in accordance with the digital input signal D.

Figure 3:
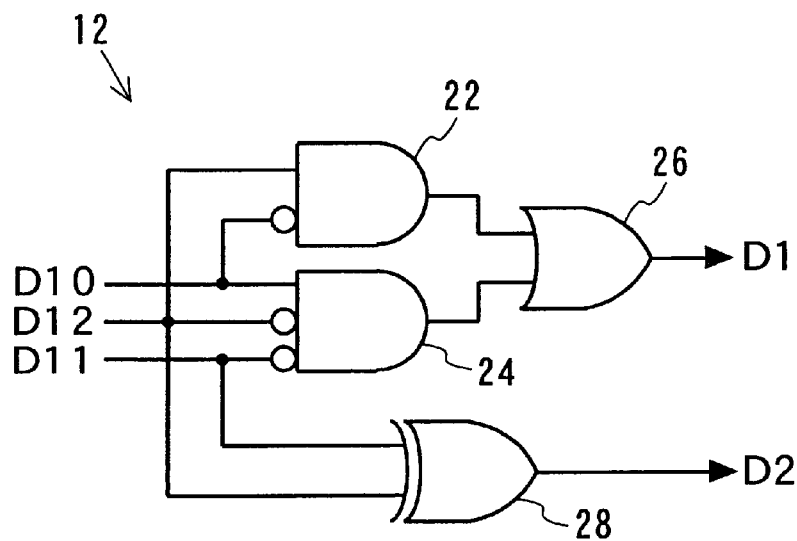
FIG. 3 is a circuit diagram showing an embodiment of a correction circuit in the D/A converter of FIG. 2.

The correction circuit 12 generates a digital correction signal "D2 D1" in accordance with the higher-order 3 bits (i.e., D12, D11 and D10) of the input digital signal D ("D12 D11 D10 D9 D8 D7 D6 D5 D4 D3"). The correction circuit 12 can be of the circuit construction as shown in FIG. 3. The circuit 12 of FIG. 3 includes AND circuits 22 and 24, an OR circuit 26 and an XOR circuit 28. An inverted signal of the bit D10 and the bit D12 are input to the AND circuit 22. The bit D11, an inverted signal of the bit D12 and the bit D10 are input to the other AND circuit 24. The outputs of the AND circuits 22 and 24 are input to the OR circuit 26. The output of the OR circuit 26 is output as a bit D1. Also, the bits D11 and D12 are input to the XOR circuit 28. The output of the XOR circuit 28 is output as a bit D2. TABLE 2 (see below) shows the relationship between the high-order 3 bits input to the correction circuit 12 (i.e., the bits D12, D11 and D10) and the outputs (i.e., the bits D2 and D1).

TABLE 2

| D12 | D11 | D10 | D2 | D1 |
| --- | --- | --- | --- | --- |
| 0 | 0 | 0 | 0 | 0 |
| 0 | 0 | 1 | 0 | 1 |
| 0 | 1 | 0 | 1 | 0 |
| 0 | 1 | 1 | 1 | 0 |
| 1 | 0 | 0 | 1 | 1 |
| 1 | 0 | 1 | 1 | 0 |
| 1 | 1 | 0 | 0 | 1 |
| 1 | 1 | 1 | 0 | 0 |

The 12-bit D/A converter 14 receives a 12-bit digital signal "D12 D11 D10 D9 D8 D7 D6 D5 D4 D3 D2 D1", in which the input signal D consists of the high-order 10 bit (i.e., "D12 D11 D10 D9 D8 D7 D6 D5 D4 D3") and the correction signal consists of the low-order 2 bits (i.e., "D2 D1"). At this point, it is regarded that the bits D2 and D1 of the correction signal have ½ weight and ¼ weight of the least significant bit (LSB) D3 of the input signal D, respectively. Accordingly, when the correction signal "D2 D1" is "11", ½·D3+¼·D3=¾·D3 (¾·LSB)the input signal D, resulting in increasing the output signal Vout obtained in accordance with the input signal D by a voltage corresponding to ¾·D3. The error $\Delta V$ is decreased by the amount of this increase, so that the nonlinear error of the output signal Vout can be corrected.

Similarly, when the correction signal "D2 D1" is "10", the output signal Vout is increased by the amount of voltage corresponding to ½·D3 (½·LSB), and when the correction signal "D2 D1" is "01", the output signal Vout is increased by the amount of voltage corresponding to ¼·D3 (¼·LSB). Also in these cases, the nonlinear error $\Delta V$ of the output signal Vout can be corrected correspondingly to these voltage increase. Furthermore, when the correction signal "D2 D1" is "00", the output signal Vout is not corrected.

Figure 4:
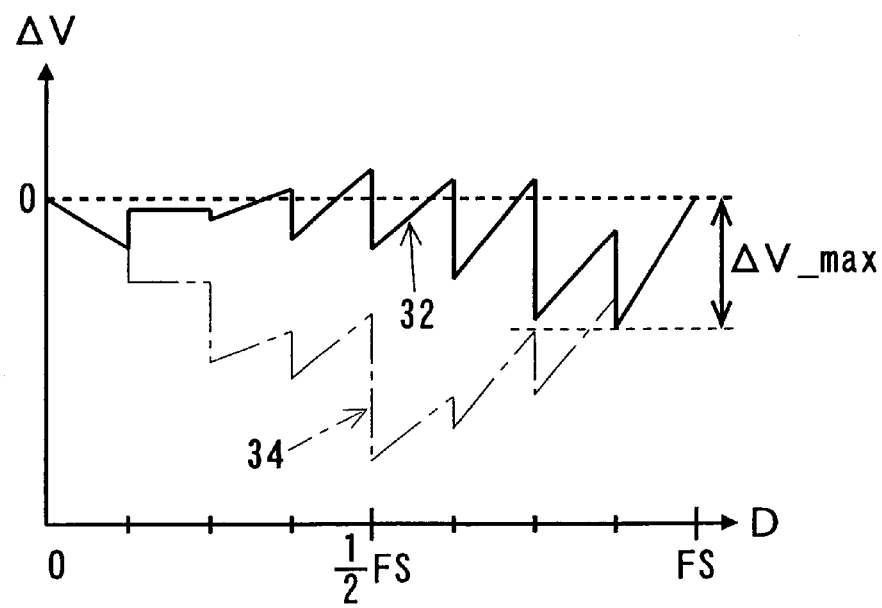
FIG. 4 is a graph roughly illustrating an error between the output voltage of the D/A converter of FIG. 2 and an ideal output voltage.

In this manner, as shown in TABLE 2 and FIG. 4, in the ranges between 0 and ⅛·FS (i.e., when "D12 D11 D10"=

"000") and between ⅞·FS and FS (i.e., when "D12 D11 D10"="111"), the output signal Vout is not corrected because the correction signal "D2 D1" is "00". In the ranges between ⅛·FS and ¼·FS (i.e., when "D12 D11 D10"="001") and between ¾·FS and ⅞·FS (i.e., when "D12 D11 D10"= "110"), the output signal Vout is corrected by the amount of voltage corresponding to ¼·D3 (¼·LSB) because the correction signal "D2 D1" is "01". In the ranges between ¼·FS and ½·FS (i.e., when "D12 D11 D10"="010" or "011") and between ⅝·FS and ¾·FS (i.e., when "D12 D11 D10"= "101"), the output voltage is corrected by the amount corresponding to ½·D3 (½·LSB) because the correction signal "D2 D11" is "10". In the range between ½·FS and ⅝·FS (i.e., when "D12 D11 D10"="100"), the output voltage is corrected by the amount corresponding to ¾·D3 (¾·LSB) because the correction signal "D2 D11" is "11".

As a result, as shown with a dashed line 34 (indicating the output of a conventional converter not using a correction circuit) and a solid line 32 (indicating the output of the present converter using the correction circuit) in FIG. 4, the maximum error ΔV_max can be decreased. Specifically, the maximum error ΔV_max is substantially halved in FIG. 4. In this manner, the accuracy degradation derived from the voltage dependence of the resistance element, which conventionally restricts the use of high-accuracy R-2R resistance net D/A converter, can be reduced by using the correction circuit 12. As a result, a high-accuracy D/A converter can be achieved without using any specific analog process.

Having described an embodiment of the present invention, the D/A converter and the D/A converting method of the present invention can also be materialized in other embodiments. For example, when a 7-bit correction signal is used, the following correction can be carried out in a maximum signal (i.e., "1111111"), with the least significant bit of an input signal indicated as LSB:

$$(½+¼+⅛+1/16+1/32+1/64+1/128)\ LSB = 0.992\ LSB \approx LSB$$

In this manner, the correction corresponding to the LSB at maximum can be carried out by increasing the number of bits of the correction signal. However, when the number of bits of the correction signal is increased, the number of components of the D/A converter (such as resistors R and 2R, switches S, and the like) is increased in accordance with the increase of the number of bits. Therefore, the number of bits of the correction signal is preferably as small as possible in consideration of compactness and low cost of the D/A converter.

Figure 5:
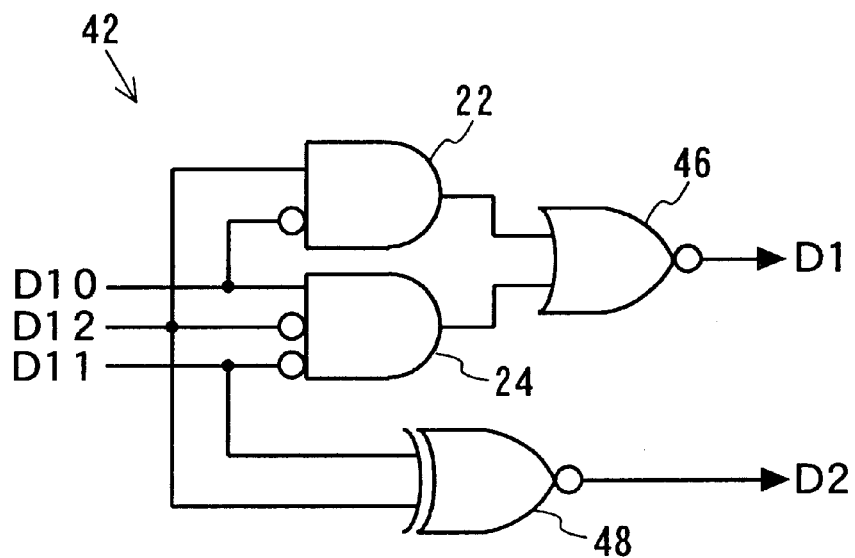
FIG. 5 is a circuit diagram showing another embodiment of the correction circuit in the D/A converter of FIG. 2.
Figure 6:
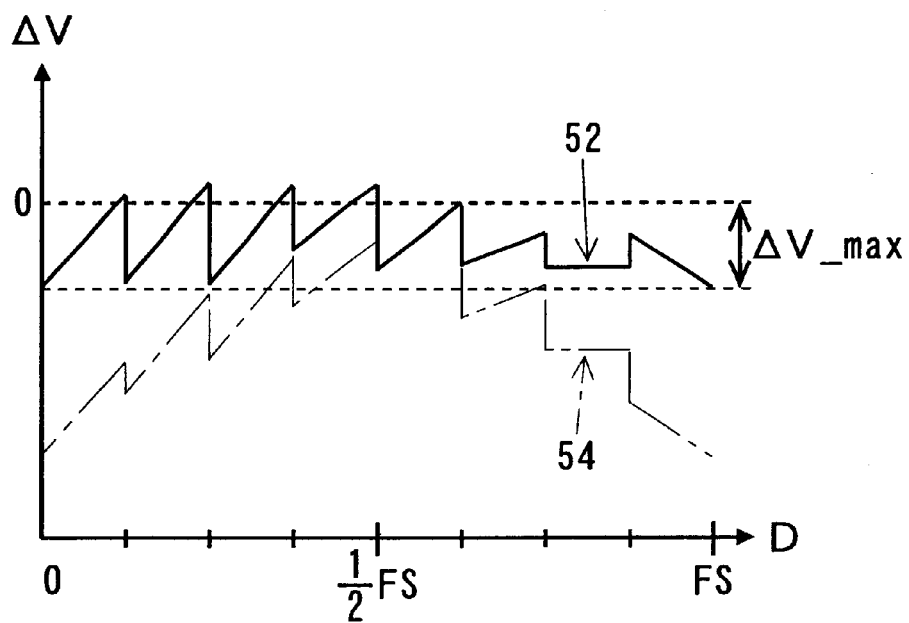
FIG. 6 is a graph roughly illustrating an error between the output voltage of the D/A converter using the correction circuit of FIG. 5 and an ideal output voltage.
Figure 7:
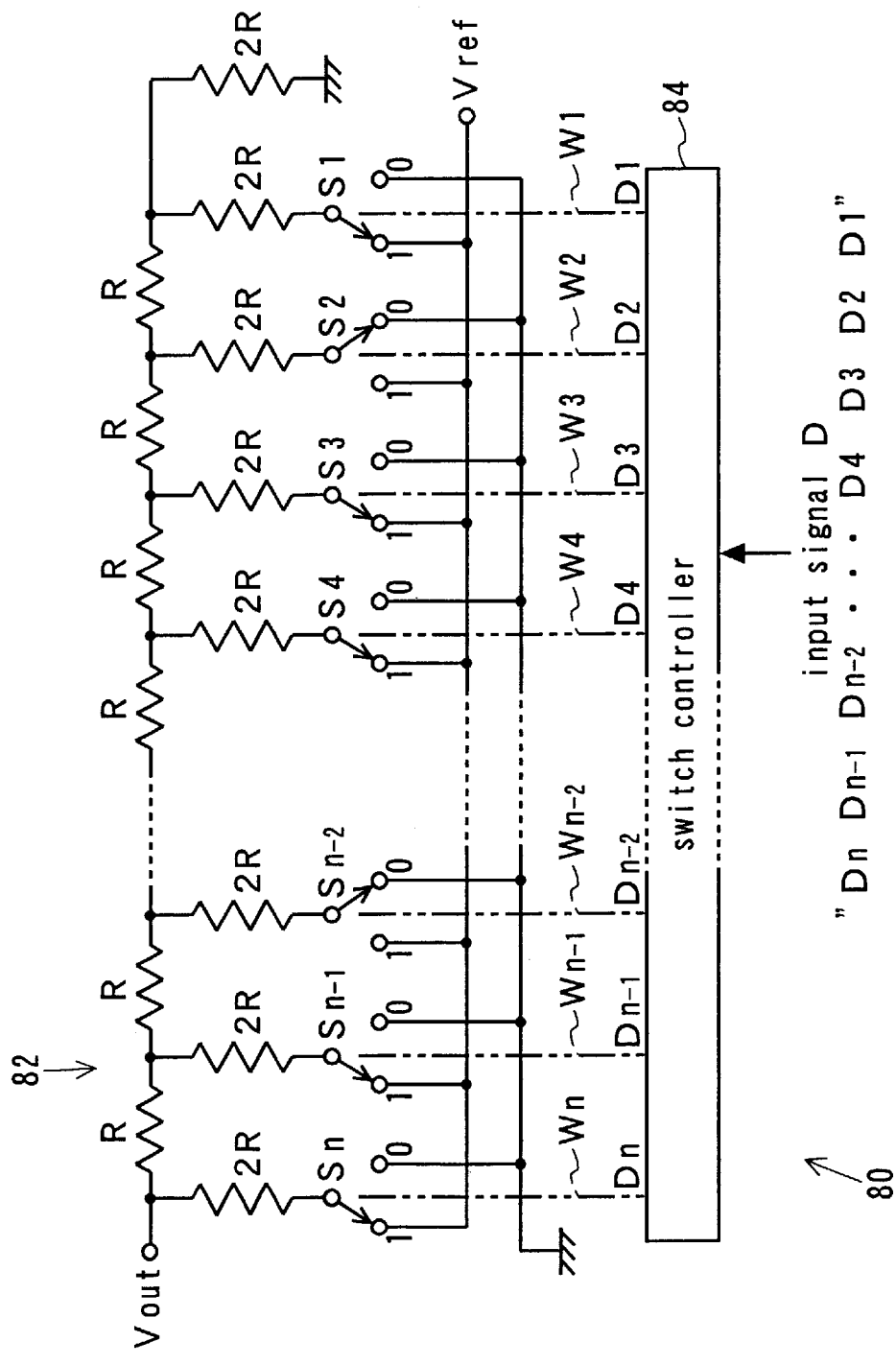
FIG. 7 is a circuit diagram showing an embodiment of a conventional n-bit D/A converter.
Figure 8:
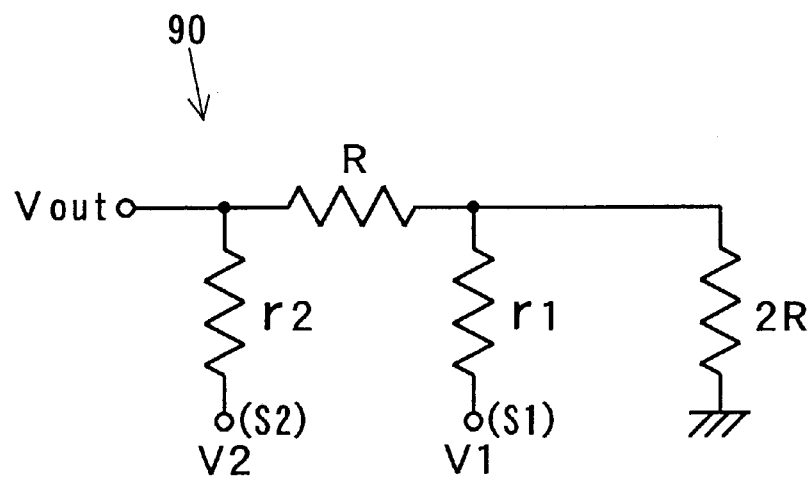
FIG. 8 is a simplified circuit diagram of the n-bit D/A converter of FIG. 7 wherein n=2.
Figure 9:
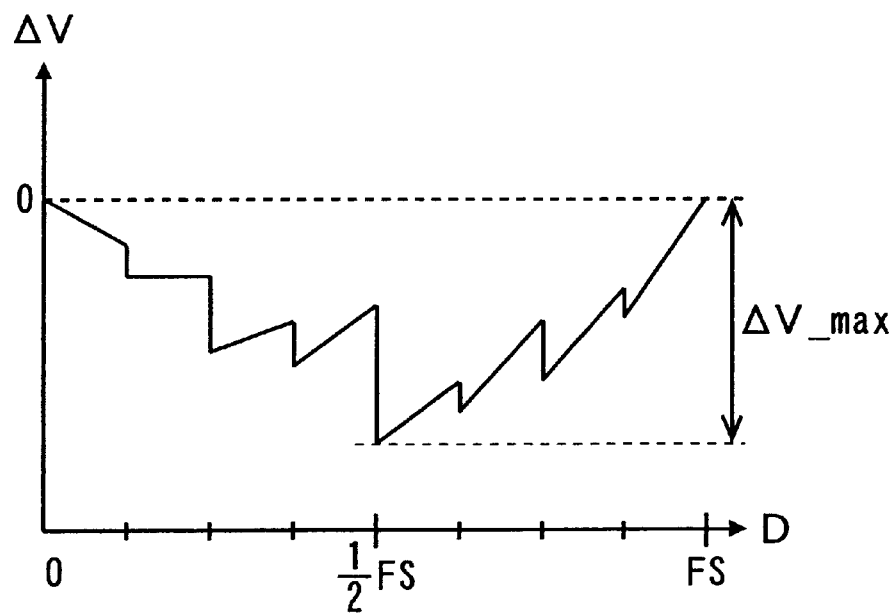
FIG. 9 is a graph roughly illustrating an error between the output voltage of the n-bit D/A converter of FIG. 7 wherein n=10 and an ideal output voltage.

Moreover, the digital correction signal generated by the correction circuit in accordance with the input signal is not limited to the outputs as shown in TABLE 2, but an arbitrary digital signal can be generated in accordance with the output characteristic of the D/A converter. Specifically, a correction signal with respect to respective bits of an input digital signal can be set on the basis of the nonlinear error of the input signal. In general, the correction signal is maximized when the nonlinear error is maximum with respect to the input signal and it is minimized when the nonlinear error is minimum with respect to the input signal. For example, in the case where the D/A converter has an output characteristic 54 as shown with a dashed line in FIG. 6, a correction circuit 42 having NOR circuit 46 and XOR-NOT circuit 48, (having output values as listed in TABLE 3 below) as shown in FIG. 5 can be used to attain an output characteristic 52 as shown with a solid line in FIG. 6 in the same manner as described in the above embodiment.

TABLE 3

| D12 | D11 | D10 | D2 | D1 |
|-----|-----|-----|----|----|
| 0 | 0 | 0 | 1 | 1 |
| 0 | 0 | 1 | 1 | 0 |
| 0 | 1 | 0 | 0 | 1 |
| 0 | 1 | 1 | 0 | 1 |
| 1 | 0 | 0 | 0 | 0 |
| 1 | 0 | 1 | 0 | 1 |
| 1 | 1 | 0 | 1 | 0 |
| 1 | 1 | 1 | 1 | 1 |

Having described the embodiments of the D/A converter and the D/A converting method according to the present invention with reference to the accompanying drawings, the present invention is not limited to the illustrated converters and the converting methods. It will be apparent to those skilled in the art that verious changes, modifications, and improvements can be made thereto without departing from the spirit or scope of the present invention.

What is claimed is:

1. A digital-to-analog converter comprising:
non-programmable correction signal generating means for generating an m-bit digital correction signal, wherein m is a positive integer, in accordance with an n-bit digital input signal, wherein n is a positive integer of 2 or more; and
digital-to-analog conversion means for converting an (n+m)-bit digital signal consisting of said n-bit input signal and said m-bit correction signal into an analog signal.

2. The digital-to-analog converter according to claim 1, wherein said correction signal generating means generates said m-bit correction signal on the basis of high-order k bits of said n-bit input signal, wherein k is a positive integer of n or less.

3. The digital-to-analog converter according to claim 2, wherein said digital-to-analog conversion means corrects a least significant bit of said n-bit input signal on the basis of said m-bit correction signal, and outputs a voltage obtained by adding an analog output voltage corresponding to a corrected value of said least significant bit to an analog output voltage corresponding to said n-bit input signal.

4. The digital-to-analog converter according to claim 3, wherein said correction signal generating means generates said m-bit correction signal in such a manner that an error between an analog output voltage corresponding to said n-bit input signal and an ideal output voltage is corrected.

5. The digital-to-analog converter according to claim 2, wherein said correction signal generating means generates said m-bit correction signal in such a manner that an error between an analog output voltage corresponding to said n-bit input signal and an ideal output voltage is corrected.

6. The digital-to-analog converter according to claim 1, wherein said correction signal generating means generates said m-bit correction signal in such a manner that an error between an analog output voltage corresponding to said n-bit input signal and an ideal output voltage is corrected.

7. The digital-to-analog converter of claim 1 wherein said correction means is a non-programmable digital circuit receiving input only from said n-bit signal.

8. The digital-to-analog converter of claim 1 wherein said correction means is a non-programmable digital circuit receiving input only from said n-bit signal.

9. The digital-to-analog converter of claim 1 wherein said correction means is a non-programmable digital circuit consisting of logic elements.

10. A digital-to-analog converting method comprising:
a correction signal generating step of generating an m-bit digital correction signal, wherein m is a positive integer, in accordance with an n-bit digital input signal, wherein n is a positive integer of 2 or more, said correction signal being generated from a non-programmable digital circuit; and
an (n+m)-bit digital-to-analog converting step of converting an (n+m)-bit digital signal consisting of said n-bit digital input signal and said m-bit digital correction signal into an analog signal.

11. The digital-to-analog converting method according to claim 10, wherein said correction signal generating step includes a substep of generating said m-bit correction signal on the basis of high-order k bits of said n-bit input signal, wherein k is a positive integer of n or less.

12. The digital-to-analog converting method according to claim 11, wherein said (n+m)-bit digital-to-analog converting step includes a substep of correcting a least significant bit of said n-bit input signal on the basis of said m-bit correction signal and adding an analog output voltage corresponding to a corrected value of said least significant bit to an analog output voltage corresponding to said n-bit input signal.

13. The digital-to-analog converting method according to claim 12, wherein said correction signal generating step includes a substep of generating said m-bit correction signal in accordance with an error between an analog output voltage corresponding to said n-bit input signal and an ideal output voltage.

14. The digital-to-analog converting method according to claim 11, wherein said correction signal generating step includes a substep of generating said m-bit correction signal in accordance with an error between an analog output voltage corresponding to said n-bit input signal and an ideal output voltage.

15. The digital-to-analog converting method according to claim 10, wherein said correction signal generating step includes a substep of generating said m-bit correction signal in accordance with an error between an analog output voltage corresponding to said n-bit input signal and an ideal output voltage.

* * * * *